United States Patent
Umemoto et al.

(10) Patent No.: US 8,102,223 B2
(45) Date of Patent: Jan. 24, 2012

(54) DIELECTRIC CERAMIC COMPOSITION, MULTILAYER COMPLEX ELECTRONIC DEVICE, MULTILAYER COMMON MODE FILTER, MULTILAYER CERAMIC COIL AND MULTILAYER CERAMIC CAPACITOR

(75) Inventors: Shusaku Umemoto, Tokyo (JP); Takashi Suzuki, Tokyo (JP); Kouichi Kakuda, Narita (JP); Hiroshi Momoi, Yurihonjo (JP); Masaki Takahashi, Nikaho (JP); Shinichi Kondo, Yurihonjo (JP)

(73) Assignee: TDK Corporation, Tokyo (JP)

( * ) Notice: Subject to any disclaimer, the term of this patent is extended or adjusted under 35 U.S.C. 154(b) by 368 days.

(21) Appl. No.: 12/453,422

(22) Filed: May 11, 2009

(65) Prior Publication Data
US 2009/0278627 A1 Nov. 12, 2009

(30) Foreign Application Priority Data

May 12, 2008 (JP) ................. 2008-125124
Apr. 20, 2009 (JP) ................. 2009-102315

(51) Int. Cl.
*H03H 7/00* (2006.01)
*C03C 14/00* (2006.01)
*C04B 35/00* (2006.01)
*H01F 5/00* (2006.01)
*H01G 4/06* (2006.01)

(52) U.S. Cl. .......... 333/185; 333/181; 501/32; 501/122; 336/200; 361/321.2; 361/321.4

(58) Field of Classification Search ............. 333/167, 333/175, 181, 184, 185; 501/32, 122, 134, 501/135, 154; 336/200; 361/321.2, 321.4, 361/321.5
See application file for complete search history.

(56) References Cited

U.S. PATENT DOCUMENTS 5,098,869 A * 3/1992 Morimoto et al. ............ 501/32
(Continued)

FOREIGN PATENT DOCUMENTS

EP 1 721 878 A1 11/2006
(Continued)

OTHER PUBLICATIONS

B. H. Seo et al.; "Effects of Alkali and Alkaline-Earth Oxides on Thermal, Dielectrical, and Optical Properties of Zinc Borate Glasses for Transparent Dielectric"; Metals and Materials International, vol. 15, No. 6, pp. 983-987, Dec. 26, 2009.*

(Continued)

*Primary Examiner* — Barbara Summons
(74) *Attorney, Agent, or Firm* — Oliff & Berridge, PLC

(57) ABSTRACT

A dielectric ceramic composition comprises as a main component, Cu oxide, Si oxide and one selected from the group consisting of Zn oxide alone and a combination of Mg oxide and Zn oxide, as a subcomponent, a glass component including B oxide and at least one selected from the group consisting of Si oxide, Ba oxide, Ca oxide, Sr oxide, Li oxide and Zn oxide, and having a glass softening point is 750° C. or less, wherein a content of said glass component is 1.5 to 15 wt % with respect to 100 wt % of said main component. According to the present invention, a dielectric ceramic composition can be provided which is available to be sintered at low temperature (for example, 950° C. or lower) while comparatively decreasing contents of a glass component, which shows good properties (specific permittivity, loss Q value and insulation resistance), and which is available to perform cofiring different materials.

6 Claims, 9 Drawing Sheets

U.S. PATENT DOCUMENTS

| | | | |
|---|---|---|---|
| 5,723,395 A * | 3/1998 | Suzuki et al. | 501/134 |
| 5,916,834 A | 6/1999 | Terashi et al. | |
| 6,713,417 B2 | 3/2004 | Chikagawa et al. | |
| 6,740,614 B2 * | 5/2004 | Kim et al. | 501/139 |
| 7,378,363 B2 * | 5/2008 | Zheng et al. | 501/136 |
| 2004/0029701 A1 * | 2/2004 | Chikagawa et al. | 501/32 |
| 2006/0142141 A1 * | 6/2006 | Ishitobi et al. | 501/136 |
| 2006/0293168 A1 * | 12/2006 | Mori et al. | 501/136 |
| 2008/0254968 A1 * | 10/2008 | Kakuda et al. | 501/137 |

FOREIGN PATENT DOCUMENTS

| | | |
|---|---|---|
| JP | A-11-209174 | 8/1999 |
| JP | B2-3030557 | 4/2000 |
| JP | A-2001-247359 | 9/2001 |
| JP | A-2002-029826 | 1/2002 |
| JP | A-2002-029827 | 1/2002 |
| JP | A-2003-2682 | 1/2003 |
| JP | A-2003-095746 | 4/2003 |
| JP | A-2007-109473 | 4/2007 |
| JP | A-2008-230948 | 10/2008 |
| WO | WO 2005/082806 A1 | 9/2005 |

OTHER PUBLICATIONS

European Search Report dated Jun. 16, 2010 in corresponding European Patent Application No. 09 15 9992.8.

* cited by examiner (A)

(B)

(C)

DIELECTRIC CERAMIC COMPOSITION, MULTILAYER COMPLEX ELECTRONIC DEVICE, MULTILAYER COMMON MODE FILTER, MULTILAYER CERAMIC COIL AND MULTILAYER CERAMIC CAPACITOR

BACKGROUND OF THE INVENTION

1. Field of the Invention

The present invention relates to a dielectric ceramic composition available to be sintered at a low temperature having low specific permittivity, and a multilayer type electronic device such as a multilayer complex electronic device, a multilayer common mode filter, a multilayer ceramic coil and a multilayer ceramic capacitor and the like wherein a dielectric ceramic composition as a dielectric layer is applied.

2. Description of the Related Art

In recent years, with a demand for reduction in size, for high performance and high frequency on an electronic device such as a cell phone and the like used in a communication field, a demand for LC complex electronic device, a common mode filter and the like having high attenuation characteristic at high frequency region is rapidly increased.

At present, Ni—Cu—Zn-based ferrite as a magnetic substance or Cu—Zn-based ferrite as a non-magnetic substance is used for a coil portion of LC complex electronic device or a common mode filter. However, effect of stray capacitance tends to be received by above material, because a specific permittivity of above material is about 15, which is comparatively high. Therefore, there is a limit for responding to the high frequency, thus, a material having further low specific permittivity is required. Also, for further high performance, a material having f·Q value and high dielectric resistance is required.

Such the LC complex electronic device, a common mode filter, a multilayer type LC complex device having a common mode are formed by cofiring different materials (for example, a capacitor portion and a coil portion). Therefore, it is necessary that coefficients of linear expansion of different materials should be conformed as far as possible. Also, for reducing cost and a direct current resistance of a conducting material, it is preferable to use a conducting material including Ag, it is required that a material which can be sintered at lower temperature less than a softening point of Ag (for example, 950° C. or lower) too.

For example, Japanese Patent Gazette No. 3030557 disclosed a dielectric ceramic material wherein 1 to 30 parts by weight of CuO, 0.6 to 5 parts by weight of manganese oxide calculated as a conversion of MnO, as low temperature firing additives, are added to 100 parts by weight of MgO.SiO$_2$ (MgO/SiO$_2$:mol ratio=1.0 to 2.0) so as to be a base material, 5 to 200 parts by weight of glass is added to 100 parts by weight of the base material.

However, in the Japanese Patent Gazette No. 3030557, the added glass is mainly PbO-based glass, using thereof tends to be not recommended from a problem of an environment burden in recent years.

Also, in Japanese Patent Laid Open Nos. 2001-247359, 2002-29826 and 2002-29827, dielectric ceramic compositions wherein a specific permittivity is relatively low and a Q-value is relatively high are disclosed. However, because a glass component included in the dielectric ceramic compositions disclosed in the above documents is large amount, there is a problem of reduction in reliability. In specific embodiments of the above documents, there are lots of samples whose sintering temperature is 1000° C. or higher, it is insufficient to make possible to sinter at a low temperature (for example, 950° C. or lower). Further, coefficients of linear expansion of samples of the embodiments are 10 ppm/° C. and the like, there was a problem that co-firing with materials having various coefficients of linear expansion.

In Japanese Patent Laid Open No. 2003-95746, a dielectric ceramic composition having relatively low specific permittivity and relative high Q-value is disclosed. However, because a glass component included in the dielectric ceramic compositions disclosed in the above document is large amount, there is a problem of reduction in reliability. Also, coefficients of linear expansion of samples of embodiments are not disclosed, thus, it was unclear as to whether it is possible to respond for cofiring with materials having various coefficients of linear expansion.

In WO2005/082806, a dielectric ceramic material wherein a borosilicate glass is added to a forsterite and a calcium titanate is disclosed. However, in the WO2005/082806, because coefficients of linear expansion of samples of embodiments are not disclosed, thus, it was unclear as to whether it is possible to respond for cofiring with materials having various coefficients of linear expansion.

SUMMARY OF THE INVENTION

The present invention has been made by considering actual circumstances, and purpose of the present invention is to provide a dielectric ceramic composition having relatively low contents of a glass component, which is available to be sintered at a low temperature (for example less than 950° C. or less), and showing excellent characteristic (specific permittivity, f·Q-value, insulation resistance) as well as available to cofiring of different materials. Also, another purpose of the present invention is to provide a multilayer complex electronic device such as a multilayer common mode filter, a multilayer type filter, a multilayer ceramic coil and a multilayer ceramic capacitor having a non-magnetic layer constituted by the dielectric ceramic composition.

In order to achieve the above purpose, a dielectric ceramic composition according to the present invention comprises; as a main component, Cu oxide, Si oxide and one selected from the group consisting of Zn oxide alone and a combination of Mg oxide and Zn oxide, as a subcomponent, a glass component including B oxide and at least one selected from the group consisting of Si oxide, Ba oxide, Ca oxide, Sr oxide, Li oxide and Zn oxide, and having a glass softening point is 750° C. or less, wherein; a content of said glass component is 1.5 to 15 wt % with respect to 100 wt % of said main component.

In the present invention, a glass component of which softening point is 750° C. or less having the above composition is included in the above mentioned range. This will allow to obtain a dielectric ceramic composition which is available to be sintered at a low temperature and to realize excellent characteristic (low specific permittivity, high f·Q-value, high insulation resistance).

Preferably, crystal phase comprising crystal structure of forsterite and/or willemite is included in the dielectric composition. When oxides of the above main component have crystal phase comprising crystal structure of forsterite (Mg$_2$SiO$_4$) and/or willemite (Zn$_2$SiO$_4$), and further, Cu is dissolved in the crystal phase, the above mentioned effect can further be improved.

Preferably, when said main component is shown by a general formula "a(bMgO.cZnO.dCuO).SiO$_2$", "a" is 1.5 to 2.4, "c" is 0.10 to 0.98, "d" is 0.02 to 0.18 (note that, b+c+d=1.00).

By setting a, b, c, d in the above mentioned general formula within the above range, the above mentioned effect can be improved further. Particularly, by changing a proportional ratio of "a", "b" and "c", crystal phase comprising crystal structure of forsterite and willemite can be produced, and its content ratio of $Zn_2SiO_4$ whose coefficient of linear expansion is $40\times10^{-7}/°C$. and $Mg_2SiO_4$ whose coefficient of linear expansion is $120\times10^{-7}/°C$. can be changed. Therefore, coefficient of linear expansion of the obtained dielectric ceramic composition can be changed arbitrarily, for example, within a range of 40 to $120\times10^{-7}/°C$. As a result, it becomes possible to perform cofiring with materials having various coefficients of linear expansion.

A multilayer complex electronic device according to the present invention comprises a coil portion constituted by a coiled conductor and a non-magnetic layer, and a capacitor portion constituted by an internal electrode layer and a dielectric layer, wherein said coiled conductor and/or said internal electrode layer include(s) Ag as a conductive material, said non-magnetic layer is constituted by any one of the above described dielectric ceramic compositions.

A multilayer common mode filter according to the present invention comprises a filter portion constituted by a coiled conductor and a non-magnetic layer, and an external layer portion constituted by a magnetic layer, wherein said coiled conductor includes Ag as a conductive material, said non-magnetic layer is constituted by any one of the above described dielectric ceramic compositions.

A multilayer complex electronic device according to the present invention comprises a capacitor portion constituted by an internal electrode layer and a dielectric layer, a common mode filter portion comprising a coiled conductor and a non-magnetic layer, and an external layer portion constituted by a magnetic layer, wherein said coiled conductor and/or said internal electrode layer include(s) Ag as a conductive material, said non-magnetic layer is constituted by any one of the above described dielectric ceramic compositions.

A multilayer ceramic coil according to the present invention comprises a coil portion constituted by stacking a coiled conductor and a non-magnetic layer, wherein said coiled conductor includes Ag as a conductive material, said non-magnetic layer is constituted by any one of the above described dielectric ceramic compositions.

A multilayer ceramic capacitor according to the present invention comprises an element body wherein an internal electrode layer and a dielectric layer are alternately stacked, wherein said internal electrode layer includes Ag as a conductive material, said dielectric layer is constituted by any one of the above described dielectric ceramic compositions.

According to the present invention, by relatively decreasing a content of a glass component including the above mentioned oxides with respect to the above mentioned main component so as to be a specific range, without reduction in reliability, it is possible to obtain a highly reliable dielectric ceramic composition showing excellent properties (specific permittivity, loss Q value, insulation resistance, etc.). Also, since a glass softening point is 750° C. or lower, it is possible to fire at a low temperature (for example, 900° C. or lower).

Further, by controlling a content ratio of Mg oxide and Zn oxide, content ratio of $Zn_2SiO_4$ whose coefficient of linear expansion is $40\times10^{-7}/°C$. and $Mg_2SiO_4$ whose coefficient of linear expansion is $120\times10^{-7}/°C$. can be changed. Therefore, coefficients of linear expansion of dielectric ceramic composition can be changed arbitrarily within, for example, 40 to $120\times10^{-7}/°C$., while maintaining excellent properties. As a result, a desired coefficient of linear expansion can be obtained.

By applying such a dielectric ceramic composition to a non-magnetic layer and a dielectric layer, it is possible to conform mostly to coefficients of linear expansion of materials facing these layers. Therefore, it becomes possible to perform cofiring with materials having various coefficients of linear expansion, while showing the above described excellent properties. Also, since it is possible to fire at a low temperature (for example, 950° C. or lower), Ag which is low in DC resistance, is usable.

DESCRIPTION OF THE PREFERRED EMBODIMENTS

Hereinafter, the present invention will be described based on embodiments shown in drawings.

LC Complex Electronic Device 1

Figure 1:
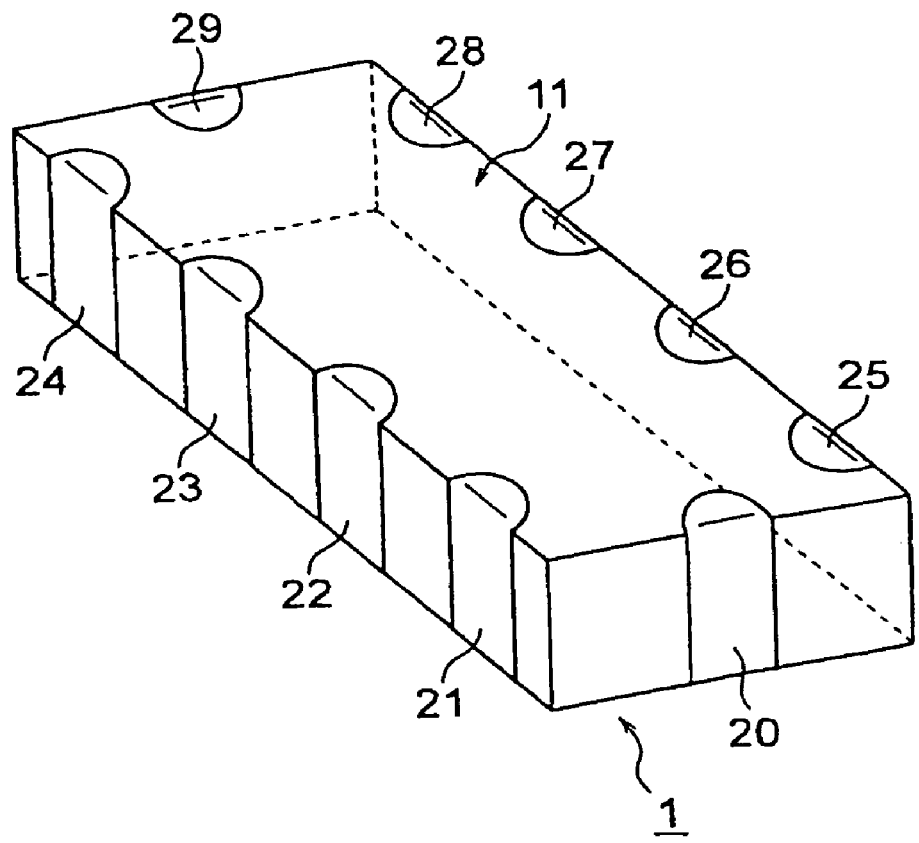
FIG. 1 is a perspective view of a LC complex electronic device according to an embodiment of the present invention.

As shown in FIG. 1, a LC complex electronic device as a multilayer complex electronic device 1 according to an embodiment of the present invention comprises a multilayer portion 11 as a main portion, external electrodes 21, 22, 23 and 24 in the left side face in the figure, external electrodes 25, 26, 27 and 28 in the right side face in the figure, an external electrode 20 in the front side face in the figure, an external electrode 29 in the back side face in the figure. The shape of the LC complex electronic device 1 is, although not particularly limited, normally a rectangular parallelepiped. Also, the size, which is not particularly limited and determined appropriately depending on the application, is normally (0.8 to 3.2 mm)×(0.6 to 1.6 mm)×(0.3 to 1.0 mm) or so. First, a structure of a LC complex electronic device according to the present embodiment will be described.

Figure 2:
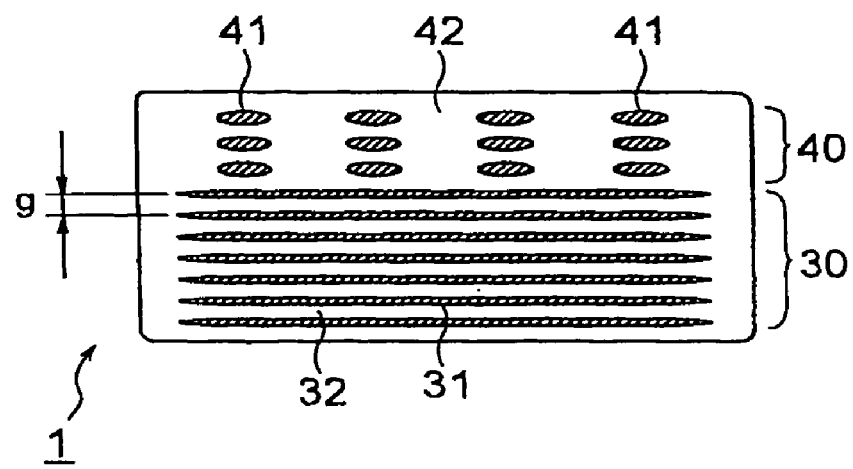
FIG. 2 is a cross sectional view of the LC complex electronic device along II-II line shown in FIG. 1.

FIG. 2 is a sectional view of the LC complex electronic device 1 along II-II line shown in FIG. 1. The LC complex electronic device 1 according to the present embodiment comprises a capacitor portion 30(C) in the lower layer portion and a coil portion 40(L) in the upper layer portion. The capacitor portion 30 is a multilayer capacitor wherein a plurality of dielectric layers 32 is formed between internal electrodes 31. On the other hand, in the coil portion 40, a coiled conductor 41 having a predetermined pattern is formed in a non-magnetic layer 42.

The dielectric layer 32 constituting the capacitor portion 30 and/or the non-magnetic layer 42 constituting the coil portion 40 include a dielectric ceramic composition according to the present invention. However, preferably, the non-magnetic layer 42 is constituted by a dielectric ceramic composition of the present invention, the dielectric layer 32 to constitute the capacitor portion 30 is constituted by a dielectric ceramic composition of titanium oxide based having relatively high specific permittivity.

The dielectric ceramic composition of the present invention includes, as a main component, Cu oxide, Si oxide and one selected from Zn oxide alone and a combination of Mg oxide and Zn oxide.

The above described oxides included as the main component may be shown as "a(bMgO.cZnO.dCuO).SiO$_2$" by using a general formula. The "a" in the general formula shows a mole ratio of A/B of Mg, Zn and Cu shown as A site atom and Si shown as B site atom. In the present embodiment, the "a" is preferably 1.5 to 2.4, more preferably 1.6 to 2.0. When the "a" is too small, sintering at lower temperature becomes insufficient and an insulating resistance and a f·Q value tend to deteriorate.

The "b", "c" and "d" in the above described general formula respectively show a content ratio of MgO, ZnO and CuO (a mole ratio) to whole oxide of A site atom. Thus, b+c+d=1.00.

In the present embodiment, the "c" is preferably 0.10 to 0.92, more preferably 0.15 to 0.92. Also, the "d" is preferably 0.02 to 0.18, more preferably 0.04 to 0.14.

Note that, the "b" is within a range of "1.00-c-d". Thus, when the "b" is 0, namely, there will be a possibility a case that MgO is not included, however, the "b" is preferably larger than 0 by a reason mentioned below.

It may be considered that the dielectric ceramic composition of the present embodiment has a composite structure wherein Mg$_2$SiO$_4$ having crystal structure of forsterite and Zn$_2$SiO$_4$ having crystal structure of willemite are coexisted.

Generally, Mg$_2$SiO$_4$ and Zn$_2$SiO$_4$ both have high melting point, and that they do not sinter at a low temperature, e.g. 950° C. or less.

However, in the present embodiment, Cu, included as a main component, is dissolved in either or both of Mg$_2$SiO$_4$ (forsterite) and Zn$_2$SiO$_4$ (willemite). Further, according to contents of Mg and Zn, Mg may be dissolved in Zn$_2$SiO$_4$ or Zn may be dissolved in Mg$_2$SiO$_4$.

When the other atom is dissolved in Mg$_2$SiO$_4$ and Zn$_2$SiO$_4$, their producing temperatures become low, therefore, even when a content of glass component is decreased, it is likely to sinter at a low temperature, e.g. 950° C. or less.

Further, the dielectric ceramic composition of the present embodiment produces crystal phase comprising crystal structure of forsterite and/or willemite by controlling a, b and c in the above general formula. Therefore, coefficient of linear expansion of the dielectric ceramic composition of the embodiment is proportional to content ratio of Mg$_2$SiO$_4$ and Zn$_2$SiO$_4$. Namely, coefficient of linear expansion is determined by a content ratio of b(MgO) and c(ZnO). Note that the dielectric ceramic composition of the embodiment may include any crystal phase except for a crystal phase comprising crystal structure of forsterite and willemite, however, the same of enstatite (Mg$_2$Si$_2$O$_6$) and the like are not preferable.

Therefore, by controlling a content ratio of b(MgO) and c(ZnO), coefficient of linear expansion of a(bMgO.cZnO.dCuO).SiO$_2$ can be changed arbitrarily.

Here, a coefficient of linear expansion of Zn$_2$SiO$_4$ alone is smaller than the same of Mg$_2$SiO$_4$ alone, and is about ⅓ of the same of Mg$_2$SiO$_4$ alone. Specifically, since a coefficient of linear expansion of Mg$_2$SiO$_4$ is an about 120×10$^{-7}$/° C., a coefficient of linear expansion of Zn$_2$SiO$_4$ is an about 40×10$^{-7}$/° C., a coefficient of linear expansion of the dielectric ceramic composition of the present embodiment may be changed arbitrarily within a range of about 40 to 120×10$^{-7}$/° C.

In the present embodiment, when the "c" is too small, sintering at lower temperature becomes insufficient and an insulating resistance and a f·Q value tend to deteriorate.

Also, in the present embodiment, when the "d" is too small, sintering at lower temperature becomes insufficient and an insulating resistance and a f·Q value tend to deteriorate. To the contrary, when the "d" is too large, the insulating resistance and the f·Q value tend to deteriorate.

Also, the dielectric ceramic composition of the present embodiment comprises, other than the above described main component, a glass component, as a subcomponent, including B oxide and at least one selected from Si oxide, Zn oxide, Ba oxide, Ca oxide, Sr oxide and Li oxide. This glass component is a low-melting glass having a glass softening point of 750° C. or lower. Note that the glass softening point is measured by JIS-R-3103.

Since the dielectric ceramic composition of the present embodiment has a glass component having a glass softening point is 750° C. or lower, it becomes possible to perform a low temperature sintering, for example, at 950° C. or lower, and it is available to apply to an electronic device wherein an internal electrode is constituted by Ag having a low DC resistance.

This glass component is not particularly limited as far as this including B oxide and at least one selected from Si oxide, Zn oxide, Ba oxide, Ca oxide, Sr oxide and Li oxide and having a glass softening point of 750° C. or lower. As these glass components, for example, B$_2$O$_3$—SiO$_2$—BaO—CaO-based glass, B$_2$O$_3$—SiO$_2$—BaO-based glass, B$_2$O$_3$—SiO$_2$—CaO-based glass, B$_2$O$_3$—SiO$_2$—SrO-based glass, B$_2$O$_3$—SiO$_2$—Li$_2$O-based glass, B$_2$O$_3$—ZnO—BaO-based glass, B$_2$O$_3$—ZnO—Li$_2$O-based glass, B$_2$O$_3$—SiO$_2$—ZnO—BaO-based glass, B$_2$O$_3$—SiO$_2$—ZnO—BaO—CaO-based glass, etc., may be mentioned. And, B$_2$O$_3$—SiO$_2$—BaO—CaO-based glass and B$_2$O$_3$—SiO$_2$—SrO-based glass are preferable as the glass component.

A content of the glass component is 1.5 to 15 wt %, preferably 3 to 5 wt % with respect to 100 wt % of the main component.

When the content of the glass component is too low, there is a tendency not to obtain sufficient sinterability at a low temperature (for example, 950° C. or lower). In contrast, when it is too large, a f·Q value tends to deteriorate, and reduction in reliability as an electronic device.

In case that the dielectric layer 32 does not include a dielectric ceramic composition of the present invention, as a dielectric material to constitute the dielectric layer 32, it is preferable to use a dielectric ceramic composition based titanium oxide, which is available to fire at 950° C. or lower. As the dielectric ceramic composition based titanium oxide, a material including titanium oxide, barium titanate, calcium titanate, strontium titanate, zinc titanate, nickel titanate and the like as a main component, and as a subcomponent, material including more than one kind, such as Cu oxide, Mn oxide and glass which include B oxide and whose glass softening point is 750° C. or lower are exemplified.

An average crystal grain size of a sintered dielectric crystal grain constituting the dielectric layer 32 is preferably 1.5 μm or less, more preferably 1.0 μm or less. The lower limit of the average crystal grain size is not particularly limited, normally 0.5 μm or so. When the average crystal grain size of the dielectric crystal grain is too large, insulation resistance tends to deteriorate.

The average crystal grain size of the dielectric crystal grain can be obtained by, for example, cutting the dielectric layer 32 to observe the cutting surface with SEM, measuring crystal grain sizes of the predetermined number of dielectric crystal grains, and calculating based on the measurement results. Note that a crystal grain size of each dielectric crystal grain can be obtained by, for example, a coding method wherein each crystal grain is assumed as a sphere. Also, at calculation of the average crystal grain size, the number of grains subject to measurement of the crystal grain size is normally 100 or more.

A thickness (g) of the dielectric layer 32 in a portion sandwiched by a pair of internal electrodes 31 is preferably 30 μm or less, more preferably 20 μm or less.

A thickness of the internal electrode 31 is not particularly limited, and it may be suitably determined in response to the thickness of the dielectric layer 32.

In the present embodiment, a non-magnetic layer 42 includes a dielectric ceramic composition of the present invention. When it does not include, as a non-magnetic material to constitute the non-magnetic layer is, for example, non-magnetic Cu—Zn based ferrite, a glass materials are exemplified.

A conducting material included in the internal electrode 31 constituting the capacitor portion 30 or in the coiled conductor 41 constituting the coil portion 40 are not particularly limited, since the dielectric ceramic composition of the present invention can be fired at a low temperature (for example, 950° C. or lower), Ag with low DC resistance may be used as a conducting material in the present embodiment. Also, by blending a dielectric material constituting the dielectric layer 32 and a non-magnetic material constituting the non-magnetic layer 42, the blended material may be used as an intermediate portion between the capacitor portion 30 and the coil portion 40. A thickness of the intermediate portion is 10 to 100 μm. By providing the intermediate portion, an interface bonding characteristic between the capacitor portion and the coil portion can be improved.

As external electrodes 20 to 29, although they are not particularly limited, an electric conductor including Ag can be used, and are preferably plated with Cu—Ni—Sn, Ni—Sn, Ni—Au, Ni—Ag, etc.

Production Method of LC Complex Electronic Device 1

The LC complex electronic device of the present embodiment is produced by, as with conventional LC complex electronic device, preparing a non-magnetic green sheet and a dielectric green sheet, stacking these green sheets, forming a green-state multilayer portion 11, and forming external electrodes 20 to 29 after firing. Hereinafter, the production method will be specifically described.

Production of Non-Magnetic Green Sheet

First, a material of a non-magnetic material to constitute the non-magnetic layer 42 is prepared. In the present embodiment, as a material of the non-magnetic material, a material of the dielectric ceramic composition is used.

As a main component material of the dielectric ceramic composition of the present invention, Mg oxide, Zn oxide, Cu oxide and Si oxide as well as mixture thereof and composite oxide can be used. It is also possible to properly select from a variety of compounds to become the above oxide or composite oxide by firing, for example, carbonate, oxalate, nitrate, hydroxide, organic metallic compound, etc., and to mix for use.

Also, as a material of the glass component which is a subcomponent of the dielectric ceramic compound of the present invention, an oxide constituting the above mentioned glass component, mixture thereof and composite oxide, in addition to a variety of compounds to become the oxide or composite oxide constituting the glass component by firing, can be used.

The glass component can be obtained by mixing materials including oxide, etc., which constitutes the glass component, firing followed by rapid cooling, and vitrifying.

In the present embodiment, the respective main component materials are blended. Also, in response to necessity, a subcomponent other than glass component may be added to the main component materials to mix. As a method of mixing each of the main component material and subcomponent material, although not particularly limited, for example, there may be mentioned a method of dry-mixing material powders in a powdery state, or of wet-mixing material powders, to which water, organic solvent, etc. is added, by using a ball mill, etc.

Next, the above obtained mixture of powder is subject to calcine. The calcine is performed at a holding temperature of preferably 850 to 1100° C., for a temperature holding time of preferably 1 to 15 hours. The calcine may be performed in the air, in an atmosphere having higher oxygen partial pressure than that in the air, or pure oxygen atmosphere.

Next, the powder obtained by calcine is pulverized to prepare a pre-fired powder and blended by adding a glass component material as the subcomponent. As a method of preparation, although not particularly limited, for example, there may be mentioned a method to add water, organic solvent, etc., to the calcined powder obtained by calcining and then to wet-mix them by using a ball mill, etc. Then, the obtained pre-fired powder is made a paste, so that a non-magnetic layer paste is prepared.

The non-magnetic layer paste may be either an organic paste wherein the pre-fired powder and organic vehicle are kneaded or water-based paste.

A coil conductor paste is obtained by kneading a conducting material, for example Ag and the like and the above organic vehicle.

A content of the organic vehicle in each of the above paste is not particularly limited and may be a normal content, for example, about 5 to 15 wt % of a binder and about 50 to 150 wt % of a solvent with respect to 100 wt % of the powder before firing. Also, each paste may include an additive selected from a variety of dispersants, plasticizers, etc., if needed. The total content is preferably 10 wt % or less.

Next, the non-magnetic layer paste is made a sheet by a doctor blade method, etc., to form a non-magnetic green sheet.

Next, a coil conductor is formed on the above produced non-magnetic green sheet. Forming the coil conductor is that a coil conductor paste is formed on the non-magnetic green sheet by a screen printing method and the like. Note that, although a forming pattern of the coil conductor may suitably selected in response to a circuit constitution and the like of a produced LC complex electronic device, in the present embodiment, they will be each patterns mentioned below.

Next, on the non-magnetic green sheet, through holes are formed. Although a producing method of the through hole is not particularly limited, for example, it can be performed by a laser processing and the like. Note that, a forming position of the through hole is not particularly limited, if it is on a coil conductor, it is preferable to form at an end portion of the coil conductor, in the present embodiment, they will be each position mentioned below.

Production of Dielectric Green Sheet

First, a main component material of a dielectric material to constitute the dielectric layer 32 is prepared to make a paste so that the dielectric layer paste is obtained. The dielectric layer paste may be prepared as similar with the above mentioned non-magnetic layer paste.

As a main component material, titanium oxide, barium titanate, calcium titanate, strontium titanate, zinc titanate, nickel titanate and the like may be used. It is also possible to properly select from variety of compounds to become the above oxide or composite oxide by firing, for example, carbonate, oxalate, nitrate, hydroxide, organic metallic compound, etc., and to mix for use. In addition, as a material of the dielectric material, starting material of subcomponents may be included in response to the necessity other than the above main component.

Note that before making the dielectric layer paste from the dielectric material, each starting material constituting the dielectric material may be preliminarily sintered, and may be pulverized the powder thereafter.

An internal electrode paste is prepared by kneading Ag as a conducting material and the above described organic vehicle.

Then, the dielectric layer paste is made a sheet by a doctor blade method, etc., to form a dielectric green sheet. Also, internal electrodes are formed on the dielectric green sheet in response to the necessity. The internal electrodes may be formed by printing an internal electrode paste by screen printing method and the like.

Stacking of Green Sheets

Next, each of the above obtained dielectric green sheet and non-magnetic green sheet are alternately stacked sequentially to form a green-state multilayer portion 11.

Figure 3:
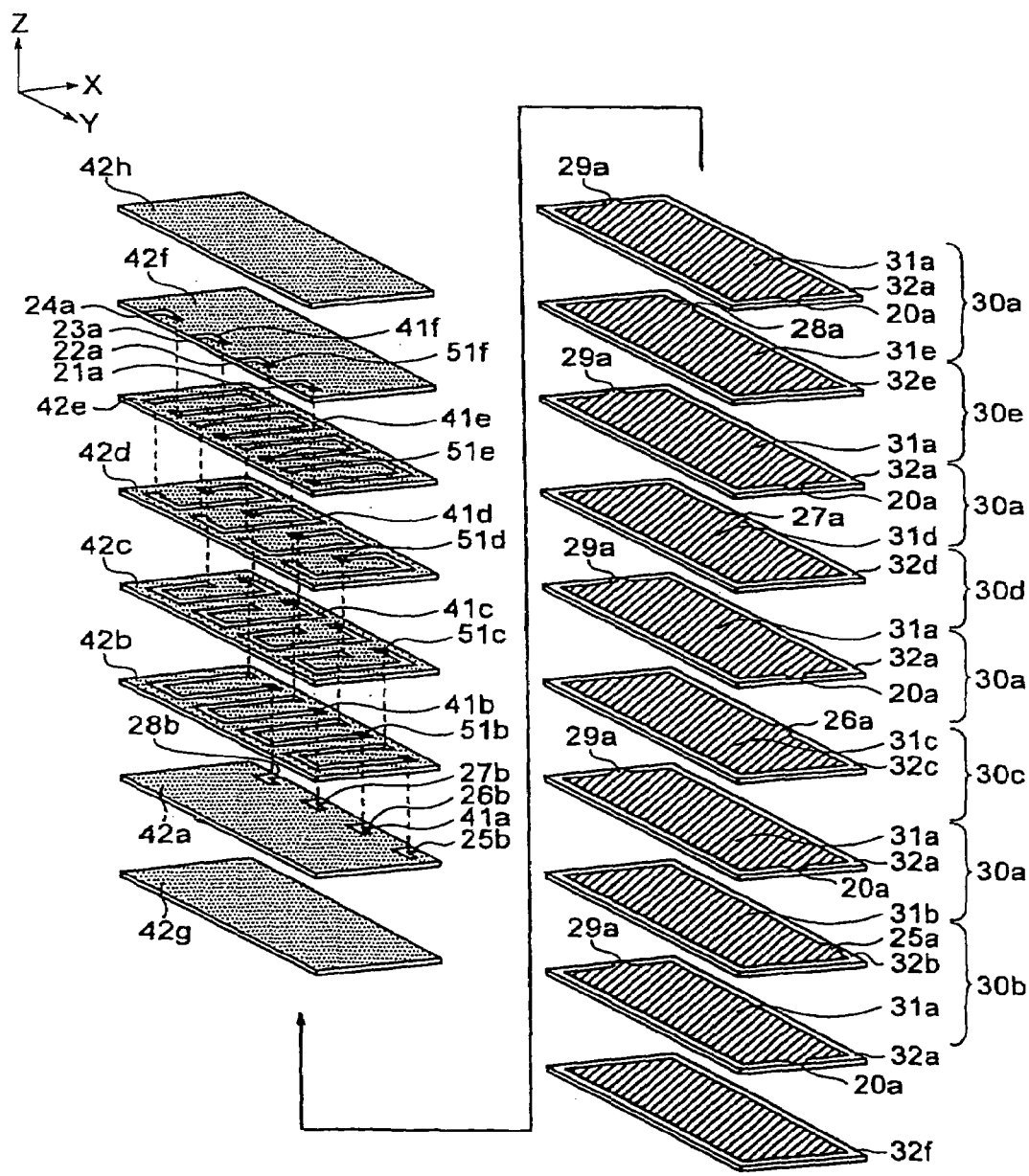
FIG. 3 is an exploded perspective view showing a laminate structure of the LC complex electronic device according to an embodiment of the present invention.

In the present embodiment, the green-state multilayer portion 11 is, as shown in FIG. 3, produced by stacking a plurality of dielectric green sheets wherein the internal electrode constituting the capacitor portion is formed, and on it, stacking a plurality of the non-magnetic green sheets wherein the coiled conductor constituting the coil portion is formed.

Below, a stacking process of the green sheets will be described in detail.

First, in the lowest layer, a dielectric green sheet 32f wherein the internal electrode is not formed is placed, a dielectric green sheet 32a wherein the internal electrode 31a having a pair of derivation portions 20a and 29a is formed is stacked. The derivation portions 20a and 29a are projected in an end portion of the dielectric green sheet from a longitudinal portion of a front side and a back side of longitudinal direction Y of the dielectric green sheet.

Next, on the dielectric green sheet 32a wherein the internal electrode 31a is formed, a dielectric green sheet 32b wherein the internal electrode 31b having a derivation portion 25a is formed is stacked. The derivation portion 25a is projected in an end portion of the dielectric green sheet from a back side of lateral direction X of the dielectric green sheet.

Next, on the dielectric green sheet 32a wherein the internal electrode 31a is formed, the dielectric green sheet 32c wherein the internal electrode 31c having a derivation portion 26a is formed is stacked. The derivation portion 26a is projected in an end portion of the dielectric green sheet from a lateral portion of a back side of lateral direction X of the dielectric green sheet. Note that, the derivation portion 26a is arranged at a back side along a longitudinal direction Y of the dielectric green sheet with respect to the derivation portion 25a.

Next, by stacking the dielectric green sheet 32a wherein the internal electrode 31a is formed, thereon, the dielectric green sheet 32d wherein the internal electrode 31d having a derivation portion 27a is formed is stacked. The derivation portion 27a is arranged at a back side along a longitudinal direction Y of the dielectric green sheet with respect to the deviation portion 26a.

Next, by stacking the dielectric green sheet 32a wherein the internal electrode 31a is formed, thereon, the dielectric green sheet 32e wherein the internal electrode 31e having a derivation portion 28a is formed is stacked. The derivation portion 28a is arranged at a back side along a longitudinal direction Y of the dielectric green sheet with respect to the deviation portion 27a.

Finally, by stacking the dielectric green sheet 32a wherein the internal electrode 31a is formed, green-state single-layer capacitors 30a to 30e are thus formed wherein the respective derivation portions are formed at different positions along a longitudinal direction Y of the dielectric green sheet.

Next, on the above-obtained green-state capacitor portions, coil portions are formed.

First, on the capacitor portions, a non-magnetic green sheet 42g wherein the coiled conductor is not formed is stacked, thereon, a non-magnetic green sheet 42a wherein four coil conductors 41a respectively having derivation portions 25b, 26b, 27b, 28b whose one ends projects from a back-side of a lateral direction X of the non-magnetic green sheet is stacked.

Next, a non-magnetic green sheet 42b wherein four approximately U-shaped coiled conductors 41b are formed is stacked thereon. Note that, as shown in FIG. 3, the approximately U-shaped coiled conductors 41b are arranged so as to have these curved portions in a front side of lateral direction X of the non-magnetic green sheet. Note that, a through hole 51b is formed in one end of the coiled conductor 41b, and the coiled conductor 41a and the coiled conductor 41b are connected via this through hole 51b by using a conductive paste.

Next, a non-magnetic green sheet 42c wherein four approximately C-shaped coiled conductors 41c are formed is stacked thereon. Note that the approximately C-shaped coiled conductor 41c is arranged so as to have its curved portion in a front side of longitudinal direction Y of the non-magnetic green sheet. Note that, as shown in FIG. 3, a through hole 51c is formed in one end of the coiled conductor 41c, and the coiled conductor 41b and the coiled conductor 41c are connected via this through hole 51c by using a conductive paste.

Next, a non-magnetic green sheet 42d wherein four approximately C-shaped coiled conductors 41d are formed is stacked thereon. Note that the approximately C-shaped coiled conductor 41d is arranged so as to have its curved portion in a front side of longitudinal direction Y of the non-magnetic green sheet. Note that, as shown in FIG. 3, a through hole 51d is formed in one end of the coiled conductor 41d, and the coiled conductor 41c and the coiled conductor 41d are connected via this through hole 51d by using a conductive paste.

Next, a non-magnetic green sheet 42e wherein four approximately U-shaped coiled conductors 41e are formed is stacked thereon. Note that, the approximately U-shaped coiled conductors 41e are arranged so as to have these curved portions in a back side of lateral direction X of the non-magnetic green sheet. Note that, as shown in FIG. 3, a through hole 51e is formed in one end of the coiled conductor 41e, and the coiled conductor 41d and the coiled conductor 41e are connected via this through hole 51e by using a conductive paste.

Next, a non-magnetic green sheet 42f wherein four coiled conductors 41f are formed is stacked thereon. The four coiled conductors 41f respectively have derivation portions 21b, 22b, 23b, 24b whose one ends project from a front side of lateral direction of the non-magnetic green sheet. Note that, a through hole 51f is formed in one end of the coiled conductor 41f, and the coiled conductor 41e and the coiled conductor 41f are connected via this through hole 51f by using a conductive paste.

Finally, a non-magnetic green sheet 42h wherein a coiled conductor is not formed is stacked on the non-magnetic green sheet 42f wherein the coiled conductor 41f is formed.

As described above, by jointing the coiled conductor on each non-magnetic green sheet via each through hole, a coil is formed.

Firing of Multilayer Portion and Formation of External Electrode

Next, the green-state multilayer portion obtained by alternately stacking the dielectric green sheet and the non-magnetic green sheet is fired. Firing conditions include a temperature rising rate of preferably 50 to 500° C./hour and further preferably 200 to 300° C./hour, a holding temperature of preferably 840 to 900° C., a temperature holding time of preferably 0.5 to 8 hours and further preferably 1 to 3 hours, and a cooling rate of preferably 50 to 500° C./hour and further preferably 200 to 300° C./hour.

Next, the fired multilayer portion is subject to end surface polishing by, for example, barrel-polishing or sand blasting, etc. The external electrodes are formed by baking after applying an external electrode paste to both side surfaces of the multilayer portion followed by drying. The external electrode paste can be prepared by kneading a conducting material such as Ag and the above organic vehicle. Note that on thus-formed external electrodes 20 to 29, it is preferable to electroplate with Cu—Ni—Sn, Ni—Sn, Ni—Au, Ni—Ag, etc.

When forming the external electrode, the external electrodes 21 to 24 become input-output terminals by connecting to the respective derivation portions 21a to 24a of the coil portion. The external electrode 25 to 28 become input-output terminals to connect the capacitor portion and the coil portion by connecting to each derivation portions 25a to 28a of the capacitor portion and derivation portions 25b to 28b of the coil portion. The external electrodes 20 and 29 become earth terminals by respectively connecting to each derivation portion 20a and 29a of the capacitor portion.

Figure 4:
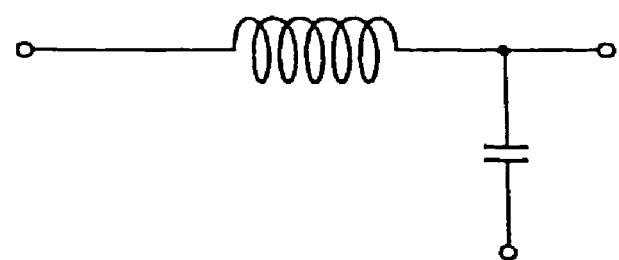
FIG. 4A is a circuit diagram of a L-shaped circuit.
FIG. 4B is a circuit diagram of a n-shaped circuit.
FIG. 4C is a circuit diagram of a T-shaped circuit.
Figure 4:
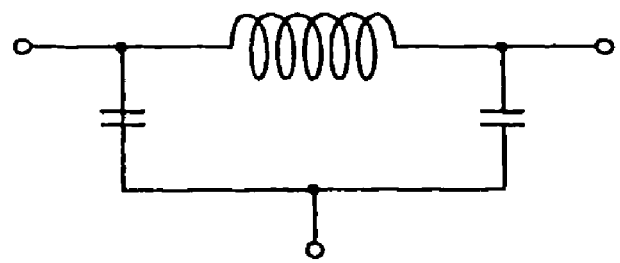
Figure 4:
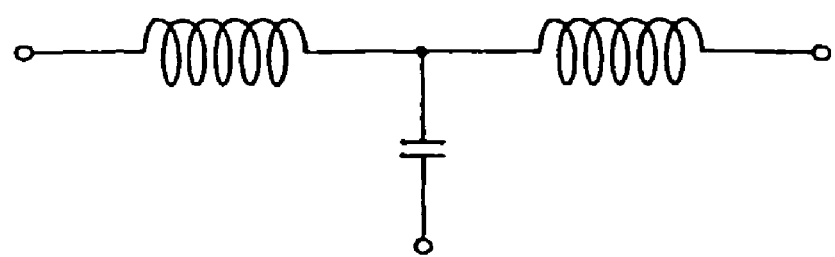

As described above, by forming each of the external electrodes 20 to 29 in the multilayer portion 11, the LC complex electronic device of the present embodiment is resulted in configuring four L-shaped circuit shown in FIG. 4A.

Thus produced LC complex electronic device of the present embodiment is mounted on a printed-circuit board, etc., by soldering, etc. to use in a variety of electronic hardware, etc.

Hereinbefore, embodiments of the present invention are described, but the present invention is not limited to the above-mentioned embodiments and can be variously modified within the scope of the present invention.

For example, the above mentioned embodiment exemplifies the LC complex electronic device wherein the four L-shaped circuits are formed, but it can be a LC complex electronic device wherein another lumped-constant circuit is formed. As an example of another lumped-constant circuit, there may be mentioned n-shaped circuit shown in FIG. 4B, T-shaped circuit shown in FIG. 4C, and double-n-shaped circuit formed by two n-shaped circuits.

In the above mentioned embodiment exemplifies a LC complex electronic device as a multilayer complex electronic device according to the present invention, but a multilayer complex electronic device according to the present invention is not limited to a multilayer type filter. Also, the dielectric ceramic composition of the present invention may be applied to, for example, a common mode filter 100 shown in FIGS. 5 and 6, other than a multilayer complex electronic device.

Namely, in the common mode filter 100 comprises a filter portion constituted by a coiled conductor and a non-magnetic layer, and an external layer constituted by a magnetic layer, the non-magnetic layer can be constituted by the dielectric ceramic composition of the present invention. By making this, the coiled conductor may be constituted by Ag having low DC resistance.

A common mode filter according to the present embodiment, as similar with the above mentioned embodiment, may be produced by producing and stacking a non-magnetic green sheet and a magnetic green sheet.

Figure 5:
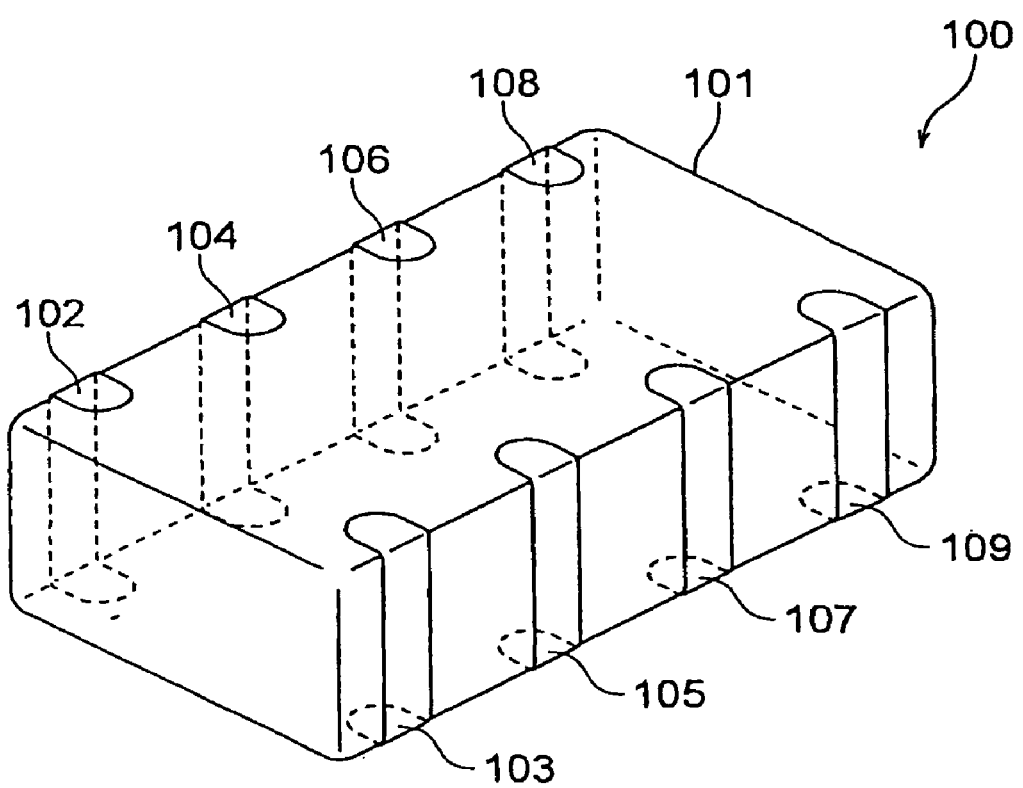
FIG. 5 is a perspective view of a multilayer common mode filter according to another embodiment of the present invention.
Figure 6:
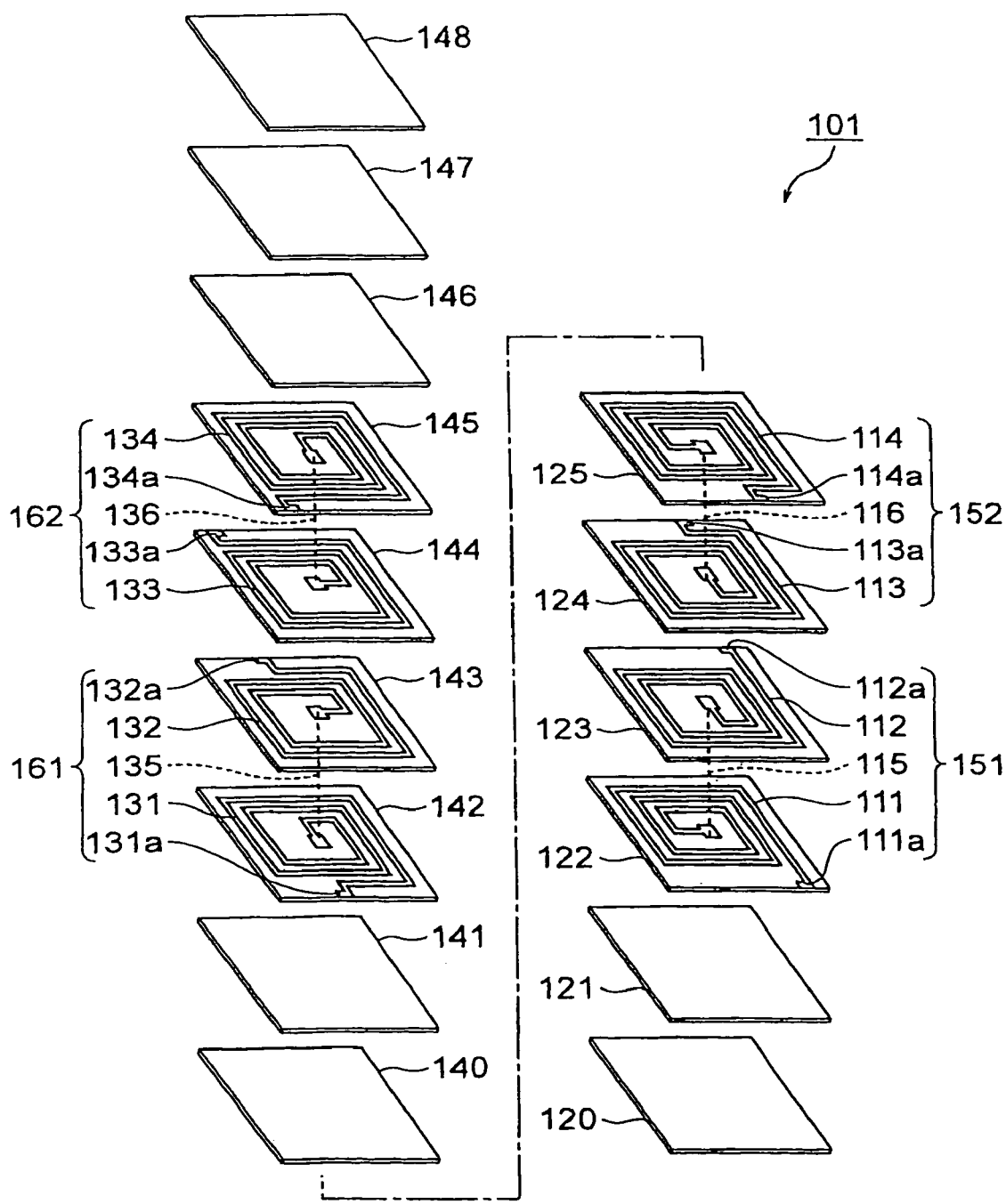
FIG. 6 is an exploded perspective view showing a laminate structure of a multilayer common mode filter according to another embodiment of the present invention.

In a common mode filter, as shown in FIG. 5, external electrodes 102 to 109 are formed on a main multilayer portion 101. This main multilayer portion 101 is constituted as shown in FIG. 6. Namely, at first, it is formed that coiled conductors 111 to 114 are helically wound around non-magnetic layers 122 to 125 of a filter portion, coiled conductors 131 to 134 are helically wound around non-magnetic layers 142 to 145 of the filter portion. Then, the non-magnetic layers 122 to 125 wherein the coiled conductors 111 to 114 are formed, and the non-magnetic layers 142 to 145 wherein the coiled conductors 131 to 134 are formed, are formed as they are sandwiched by non-magnetic layers 120, 121 and magnetic layers 146 to 148 via intermediate layers 140, 141.

The coiled conductors 111 and 112 are connected via a through hole electrode 115 to form a coil 151. Also, coiled conductors 113 and 114 are connected via a through hole electrode 116 to form a coil 152. Then, these coils 151 and 152 are magnetically coupled.

Similarly, coils 161 and 162 are, as shown in FIG. 6, formed by coiled conductors 131 to 134 and through hole electrodes 135, 136 to be magnetically coupled each other.

Figure 7:
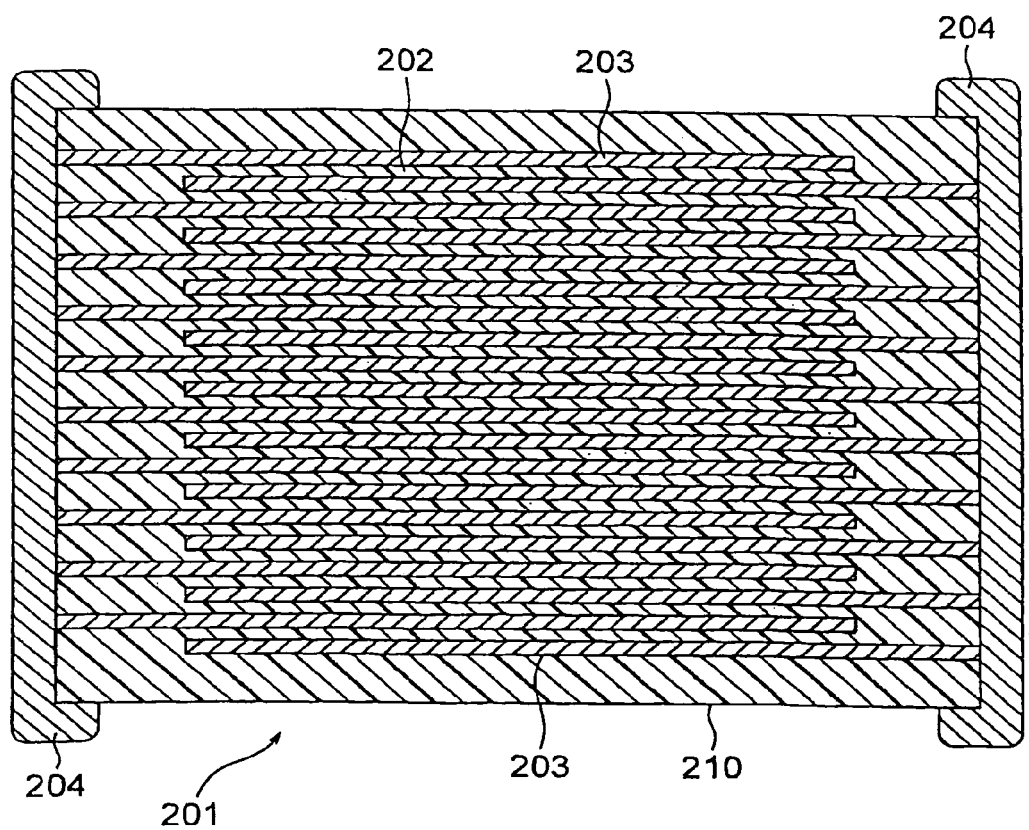
FIG. 7 is a cross sectional view of a multilayer ceramic capacitor according to another embodiment of the present invention.

Then, the above described coiled deviations 111a to 114a and 131a to 134a are respectively connected with external electrodes 102 to 109, and being to form input-output terminals Also, the dielectric ceramic composition of the present invention may be applied to a non-magnetic layer of a multilayer ceramic coil having a coil portion constituted by stacking a coiled conductor and a non-magnetic layer. In this case, it is preferred to use Ag as a coiled conductor. Further, as shown in FIG. 7, it may be applied to a multilayer ceramic capacitor comprising an element body 210, wherein dielectric layers 202 and internal electrode layers 203 are alternately stacked, and both end portions of which external electrodes 204 are formed. In this case, it is preferred to use Ag as a conductive material in the internal electrode layer.

Further, the dielectric ceramic composition of the present invention may be applied to a non-magnetic layer of a multilayer complex electronic device wherein a common mode filter shown in FIG. 6 and a multilayer ceramic capacitor shown in FIG. 7 are multilayered with complexation. In this case, it is preferred to use Ag as a conductive material in coiled conductors 111 to 114, 131 to 134 or the internal electrode layer 203.

EXAMPLES

Hereinafter, the present invention will be described based on the further detailed examples, but the present invention is not limited to the examples.

Example 1

First, MgO, ZnO, CuO, $SiO_2$ as a main component material constituting a dielectric ceramic composition material and $B_2O_3$—$SiO_2$—BaO—CaO-based glass as a subcomponent material was prepared. Note that, as the $B_2O_3$—$SiO_2$—BaO—CaO-based glass, a commercial glass was used. And a glass softening point of the glass was 700° C.

Then, materials of the main components were weighed and compounded so that "a", "b", "c", "d" in a general formula a(bMgO.cZnO.dCuO).$SiO_2$ become values shown in Table 1 after sintering, and wet mixed by a ball mill for 24 hours. After wet mixing, the obtained slurry was dried by a dryer, followed by calcine at 1000° C. of the dried mixture of powders in a batch furnace to obtain a calcined powder. The $B_2O_3$—$SiO_2$—BaO—CaO-based glass as a subcomponent material was added to the calcined powder, wet mixed by a ball mill for 16 hours, and the obtained slurry was dried by a dryer to obtain a material of a dielectric ceramic composition material according to the present invention.

Next, to the dielectric ceramic composition material, an acrylic resin diluted by a solvent was added as an organic binder, and after granulating, it was subject to pressure forming to obtain a discoid pressed article with a diameter of 12 mm and a thickness of 6 mm. The pressed article was fired in the air under a condition of 900° C.-2 h to obtain a sintered body.

As for the obtained sintered body, a density of the sintered body was calculated based on dimensions and weight of the sintered body after firing to calculate a relative density as the density of the sintered body with respect to theoretical density. The relative density of 90% or more was evaluated as GOOD. The results are shown in Table 1.

Specific Permittivity $\epsilon r$

To the obtained sintered body, a specific permittivity (no unit) was calculated by a resonance method (JIS R 1627) with using a network analyzer (8510C by HEWLETT PACKARD). As an evaluation criterion, those of 7.50 or less were evaluated as GOOD. The results are shown in Table 1.

f·Q Value

Q value was measured under the same measurement conditions as the specific permittivity with multiplying a oscillation frequency fr thereto to evaluate f·Q Value (GHz). The higher f·Q Value is preferable. As an evaluation criterion, those of 10000 GHz or more were evaluated as GOOD. The results are shown in Table 1.

Insulation Resistance ($\rho$)

First, as for the sintered body wherein electrodes were formed, a resistance value was measured after applying 25V of DC at 25° C. for 30 seconds by using an insulation resistance meter (4329A by HEWLETT PACKARD). Based on the measurement, and an electrode area and a thickness of the sintered body, an insulation resistance $\rho(\Omega \cdot m)$ was calculated. In the present example, 20 samples were subject to measurement to obtain the average, which was used for evaluation. As an evaluation criterion, those of $1.0 \times 10$ $\Omega \cdot m$ or more were evaluated as GOOD. The results are shown in Table 1.

Coefficient of Linear Expansion ($\alpha$)

To the obtained sintered body, a thermal expansion from a room temperature to 700° C. was measured and a coefficient thermal expansion coefficient $\alpha$ ($10^{-7}/°$ C.) was calculated by using a thermal expansion meter (TD5000SA by BRUKER AXS). The results are shown in Table 1.

X-Ray Diffraction

X-ray diffraction was performed to the obtained sintered body using an X-ray diffraction device (PANalytical-MPD by Spectris Co., Ltd.). Cu—K$\alpha$ X-ray was used for an X-ray source. Measurement conditions were; voltage of 45 kV, electric current of 40 mA, and within a range of $2\theta=20°$ to $60°$, angular step width was set at $0.033°$ and counting time was 0.20 sec.

TABLE 1

| Sample No. | subcomponent glass (wt %) | main component | | | | sintered body property | | | | |
| | | mole ratio a | MgO b | ZnO c | CuO d | relative dencity | specific permittiveity $\epsilon s$ | insulation resistance $\rho$ ($\Omega \cdot m$) | f·Q (GHz) | coefficient of linear expansion $\alpha$ ($\times 10^{-7}/°$ C.) |
|---|---|---|---|---|---|---|---|---|---|---|
| *1 | 1.0 | 2.0 | 0.66 | 0.26 | 0.08 | 75.7% | 5.28 | 1.4E+08 | 5671 | 98.4 |
| *2 | 1.0 | 2.0 | 0.56 | 0.26 | 0.18 | 88.2% | 6.38 | 1.7E+10 | 8278 | 98.6 |
| 3 | 1.5 | 2.0 | 0.56 | 0.26 | 0.18 | 95.0% | 7.35 | 9.7E+12 | 12057 | 98.0 |
| 4 | 3.0 | 2.0 | 0.66 | 0.26 | 0.08 | 92.5% | 6.91 | 3.0E+12 | 31495 | 99.6 |
| 5 | 5.0 | 2.0 | 0.66 | 0.26 | 0.08 | 95.7% | 7.30 | 5.9E+12 | 23259 | 100.8 |
| 6 | 7.0 | 2.0 | 0.66 | 0.26 | 0.08 | 95.6% | 7.27 | 5.7E+12 | 17925 | 101.5 |
| 7 | 10.0 | 2.0 | 0.66 | 0.26 | 0.08 | 96.1% | 7.30 | 2.6E+12 | 14357 | 103.6 |
| 8 | 15.0 | 2.0 | 0.66 | 0.26 | 0.08 | 95.4% | 7.35 | 1.4E+12 | 11489 | 106.0 |
| *9 | 16.0 | 2.0 | 0.66 | 0.26 | 0.08 | 95.0% | 7.34 | 1.7E+12 | 7527 | 107.2 |
| *10 | 20.0 | 2.0 | 0.66 | 0.26 | 0.08 | 94.7% | 7.37 | 1.5E+12 | 4779 | 108.9 |

*shows comparative example
in Table, (mE+n) means (m × $10^{+n}$)

From Table 1, when a content of a glass component is less than a range of the present invention (Samples 1, 2), sintering at 900° C. becomes insufficient. As a result of this, it can be confirmed that desired properties of insulation resistance and f·Q Value cannot be obtained. Also, when a content of the glass component is larger than a range of the present invention (Samples 9, 10), it can be confirmed that f·Q Value becomes deteriorated, even though the sinterability is sufficient.

Contrary to this, when a content of glass component is in a range of the present invention (Samples 3 to 8), it can be confirmed that sufficient sinterability and good property are shown.

Note that, according to the above X-ray diffraction, all the samples (Samples 1 to 10) were confirmed to have crystal phase comprising crystal structure of $Mg_2SiO_4$ and $Zn_2SiO_4$. Further, crystal phase of glass composition was not confirmed and that it was considered forming noncrystalline grain boundary phase.

Example 2

Except for changing the contents and the composition of the glass component to those shown in Table 2 and changing the "a", "b", "c" and "d" of the above described general formula to those shown in Table 2, a dielectric ceramic composition was produced as with Sample 1, and same evaluation was performed as in Example 1. The results are shown in Table 2. Note that, a glass softening point of the respective glass components are temperatures shown in Table 2.

TABLE 2

| Sample No. | subcomponent glass component | (wt %) | softening point | main component mole ratio a | MgO b | ZnO c | CuO d | sintered body property relative dencity | specific permittiveity $\epsilon s$ | insulation resistance $\rho$ ($\Omega \cdot m$) | $f \cdot Q$ (GHz) | coefficient of linear expansion $\alpha$ ($\times 10^{-7}/°C$.) |
|---|---|---|---|---|---|---|---|---|---|---|---|---|
| 11 | $B_2O_3$—$SiO_2$—BaO | 4.0 | 680 | 2.0 | 0.66 | 0.26 | 0.08 | 96.4% | 6.97 | 1.5E+13 | 21400 | 98.4 |
| 12 | $B_2O_3$—$SiO_2$—CaO | 4.0 | 720 | 2.0 | 0.66 | 0.26 | 0.08 | 96.0% | 6.92 | 1.2E+13 | 17945 | 98.6 |
| 13 | $B_2O_3$—$SiO_2$—SrO | 4.0 | 700 | 2.0 | 0.56 | 0.26 | 0.18 | 97.8% | 7.15 | 1.5E+13 | 18438 | 98.0 |
| 14 | $B_2O_3$—$SiO_2$—$Li_2O$ | 4.0 | 610 | 2.0 | 0.66 | 0.26 | 0.08 | 98.9% | 7.34 | 1.0E+13 | 30249 | 99.6 |
| 15 | $B_2O_3$—$SiO_2$—BaO—CaO | 4.0 | 700 | 2.0 | 0.66 | 0.26 | 0.08 | 95.0% | 7.17 | 5.9E+12 | 26126 | 101.9 |
| 16 | $B_2O_3$—ZnO—BaO | 4.0 | 610 | 2.0 | 0.66 | 0.26 | 0.08 | 92.8% | 6.59 | 1.2E+12 | 19000 | 101.5 |
| 17 | $B_2O_3$—ZnO—$Li_2O$ | 4.0 | 550 | 2.0 | 0.66 | 0.26 | 0.08 | 98.2% | 7.30 | 5.9E+12 | 30119 | 103.6 |
| 18 | $B_2O_3$—$SiO_2$—ZnO—BaO | 4.0 | 600 | 2.0 | 0.66 | 0.26 | 0.08 | 92.6% | 6.58 | 9.3E+11 | 18727 | 106.0 |
| 19 | $B_2O_3$—$SiO_2$—ZnO—BaO—CaO | 4.0 | 590 | 2.0 | 0.66 | 0.26 | 0.08 | 91.9% | 6.59 | 4.8E+11 | 18298 | 107.2 |
| *20 | $B_2O_3$—$SiO_2$—$Al_2O_3$ | 4.0 | 800 | 2.0 | 0.66 | 0.26 | 0.08 | 60.2% | 5.03 | 4.7E+07 | 1822 | 108.9 |
| *21 | $SiO_2$—ZnO—BaO | 4.0 | 780 | 2.0 | 0.66 | 0.26 | 0.08 | 83.8% | 5.74 | 5.5E+09 | 6249 | 109.9 |

*shows comparative example
in Table, (mE+n) means (m × 10$^{+n}$)

From Table 2, when a composition of a glass component is not a composition of the present invention or a glass softening point is not within a range of the present invention (Samples 20, 21), sintering at 900° C. becomes insufficient, as a result, it can be confirmed that desired properties of insulation resistance and f·Q Value cannot be obtained.

Contrary to this, when a composition of glass component is a composition of the present invention and a glass softening point is within a range of the present invention (Samples 11 to 19), it can be confirmed that sufficient sinterability and good property are shown.

Note that, according to the above X-ray diffraction, all the samples (Samples 11 to 21) were confirmed to have crystal phase comprising crystal structure of $Mg_2SiO_4$ and $Zn_2SiO_4$.

Example 3

Except for changing the "a", "c", "d" in the above described generic formula to those shown in Tables 3 to 5, a dielectric ceramic composition was produced as with Example 1, and same evaluation was performed as in Example 1. The results are shown in Tables 3 to 5.

TABLE 3

| Sample No. | subcomponent glass (wt %) | main component mole ratio a | MgO b | ZnO c | CuO d | sintered body property relative dencity | specific permittiveity $\epsilon s$ | insulation resistance $\rho$ ($\Omega \cdot m$) | $f \cdot Q$ (GHz) | coefficient of linear expansion $\alpha$ ($\times 10^{-7}/°C$.) |
|---|---|---|---|---|---|---|---|---|---|---|
| 22 | 4.0 | 1.0 | 0.66 | 0.26 | 0.08 | 53.9% | 3.91 | 3.0E+07 | 1754 | 134.4 |
| 23 | 4.0 | 1.3 | 0.66 | 0.26 | 0.08 | 69.8% | 4.90 | 2.6E+07 | 3862 | 116.9 |
| 24 | 4.0 | 1.6 | 0.66 | 0.26 | 0.08 | 90.1% | 6.92 | 2.0E+12 | 23259 | 104.3 |
| 25 | 4.0 | 1.9 | 0.66 | 0.26 | 0.08 | 94.1% | 7.08 | 5.9E+12 | 26104 | 103.5 |
| 26 | 4.0 | 2.0 | 0.66 | 0.26 | 0.08 | 95.0% | 7.17 | 5.9E+12 | 26126 | 101.9 |
| 27 | 4.0 | 2.2 | 0.66 | 0.26 | 0.08 | 96.1% | 7.27 | 3.3E+12 | 17520 | 99.2 |
| 28 | 4.0 | 2.4 | 0.66 | 0.26 | 0.08 | 96.3% | 7.28 | 1.2E+12 | 10498 | 103.2 |
| 29 | 4.0 | 2.5 | 0.66 | 0.26 | 0.08 | 96.3% | 7.29 | 1.0E+12 | 8503 | 104.5 |
| 30 | 4.0 | 2.7 | 0.66 | 0.26 | 0.08 | 95.0% | 7.20 | 3.5E+10 | 2485 | 104.1 | in Table, (mE+n) means (m × 10$^{+n}$)

TABLE 4

| Sample No. | subcomponent glass (wt %) | main component mole ratio a | MgO b | ZnO c | CuO d | sintered body property relative dencity | specific permittiveity $\epsilon s$ | insulation resistance $\rho$ ($\Omega \cdot m$) | $f \cdot Q$ (GHz) | coefficient of linear expansion $\alpha$ ($\times 10^{-7}/°C$.) |
|---|---|---|---|---|---|---|---|---|---|---|
| *31 | 4.0 | 2.0 | 0.92 | 0.00 | 0.08 | 56.3% | 4.61 | 5.4E+08 | 2401 | 123.1 |
| 32 | 4.0 | 2.0 | 0.87 | 0.05 | 0.08 | 67.2% | 5.18 | 1.8E+09 | 3432 | 122.4 |
| 33 | 4.0 | 2.0 | 0.77 | 0.05 | 0.18 | 87.2% | 6.33 | 2.4E+10 | 9018 | 122.6 |
| 34 | 4.0 | 2.0 | 0.72 | 0.10 | 0.18 | 90.5% | 6.93 | 2.0E+12 | 16305 | 120.0 |
| 35 | 4.0 | 2.0 | 0.77 | 0.15 | 0.08 | 91.1% | 6.97 | 2.1E+12 | 25967 | 117.2 |
| 35 | 4.0 | 2.0 | 0.72 | 0.20 | 0.08 | 93.5% | 7.05 | 1.8E+12 | 25580 | 112.6 |
| 37 | 4.0 | 2.0 | 0.62 | 0.30 | 0.08 | 95.4% | 7.04 | 1.5E+12 | 25311 | 91.6 |
| 38 | 4.0 | 2.0 | 0.47 | 0.45 | 0.08 | 97.6% | 7.05 | 2.6E+12 | 25575 | 84.2 |

TABLE 4-continued

| Sample No. | subcomponent glass (wt %) | main component | | | | sintered body property | | | |
|---|---|---|---|---|---|---|---|---|---|
| | | mole ratio a | MgO b | ZnO c | CuO d | relative dencity | specific permittiveity $\epsilon s$ | insulation resistance $\rho$ ($\Omega \cdot m$) | $f \cdot Q$ (GHz) | coefficient of linear expansion $\alpha$ ($\times 10^{-7}/°C$.) |
| 39 | 4.0 | 2.0 | 0.27 | 0.65 | 0.08 | 99.4% | 7.08 | 6.9E+12 | 25521 | 54.4 |
| 40 | 4.0 | 2.0 | 0.00 | 0.92 | 0.08 | 99.6% | 7.09 | 3.8E+12 | 23672 | 40.2 |

*shows comparative example
in Table, (mE+n) means (m × 10$^{+n}$)

TABLE 5

| Sample No. | subcomponent glass (wt %) | main component | | | | sintered body property | | | |
|---|---|---|---|---|---|---|---|---|---|
| | | mole ratio a | MgO b | ZnO c | CuO d | relative dencity | specific permittiveity $\epsilon s$ | insulation resistance $\rho$ ($\Omega \cdot m$) | $f \cdot Q$ (GHz) | coefficient of linear expansion $\alpha$ ($\times 10^{-7}/°C$.) |
| 41 | 4.0 | 2.0 | 0.74 | 0.26 | 0.00 | 53.6% | 4.77 | 3.2E+07 | 1771 | 94.8 |
| 42 | 15.0 | 2.0 | 0.74 | 0.26 | 0.00 | 84.2% | 5.89 | 2.5E+09 | 5392 | 96.3 |
| 43 | 15.0 | 2.0 | 0.72 | 0.26 | 0.02 | 92.0% | 6.93 | 3.7E+12 | 10352 | 99.8 |
| 44 | 4.0 | 2.0 | 0.70 | 0.26 | 0.04 | 90.2% | 6.85 | 2.2E+12 | 20995 | 98.9 |
| 45 | 4.0 | 2.0 | 0.68 | 0.26 | 0.06 | 93.4% | 6.99 | 3.0E+12 | 27640 | 97.8 |
| 46 | 4.0 | 2.0 | 0.64 | 0.26 | 0.10 | 97.7% | 7.34 | 1.5E+13 | 26684 | 98.5 |
| 47 | 4.0 | 2.0 | 0.60 | 0.26 | 0.14 | 98.7% | 7.41 | 7.4E+11 | 23166 | 98.0 |
| 48 | 4.0 | 2.0 | 0.56 | 0.26 | 0.18 | 99.5% | 7.42 | 8.3E+11 | 10598 | 99.7 |
| 49 | 4.0 | 2.0 | 0.54 | 0.26 | 0.20 | 99.2% | 7.4 | 5.9E+10 | 5542 | 99.0 | in Table, (mE+n) means (m × 10$^{+n}$)

From Table 3, when a value of "a" in the above described general formula is less than a preferred range of the present invention (Samples 22, 23), sintering at 900° C. becomes insufficient, as a result, it can be confirmed that desired properties of insulation resistance and f·Q Value cannot be obtained. Also, when a vale of "a" is larger than a preferable range of the present invention (Samples 29, 30), it can be confirmed that f·Q Value becomes deteriorated, even though the sinterability is sufficient.

Contrary to this, when a vale of "a" is within a preferable range of the present invention (Samples 24 to 28), it can be confirmed that sufficient sinterability and good property are shown.

Note that, according to the above X-ray diffraction, sample 22 was confirmed to have crystal phase comprising crystal structure of $Zn_2SiO_4$ and $Mg_2Si_2O_6$. Further, according to sample 23, crystal phase comprising crystal structure of $Mg_2SiO_4$, $Zn_2SiO_4$ and $Mg_2Si_2O_6$ were confirmed. Samples 24 to 28 were confirmed to have the same of $Mg_2SiO_4$ and $Zn_2SiO_4$. Furthermore, samples 29 and 30 were confirmed to have ZnO residue in addition to crystal phase comprising crystal structure of $Mg_2SiO_4$ and $Zn_2SiO_4$.

From Table 4, when a value of "c" in the above described general formula is less than a preferred range of the present invention (Samples 31 to 33), sintering at 900° C. becomes insufficient, as a result, it can be confirmed that desired properties of insulation resistance and f·Q Value cannot be obtained.

Contrary to this, when a value of "c" is within a preferable range of the present invention (Samples 34 to 40), it can be confirmed that sufficient sinterability and good property are shown. Also, in Table 4, a proportional ratio of b(MgO amount) and c(ZnO amount) is changed. By making this, it can be confirmed that coefficients of linear expansion can be changed arbitrarily within a range of 40 to 120×10$^{-7}/°$ C., while maintaining good properties of specific permittivity, insulation resistance and f·Q Value. This can also be explained by the following results of X-ray diffraction.

Figure 8:
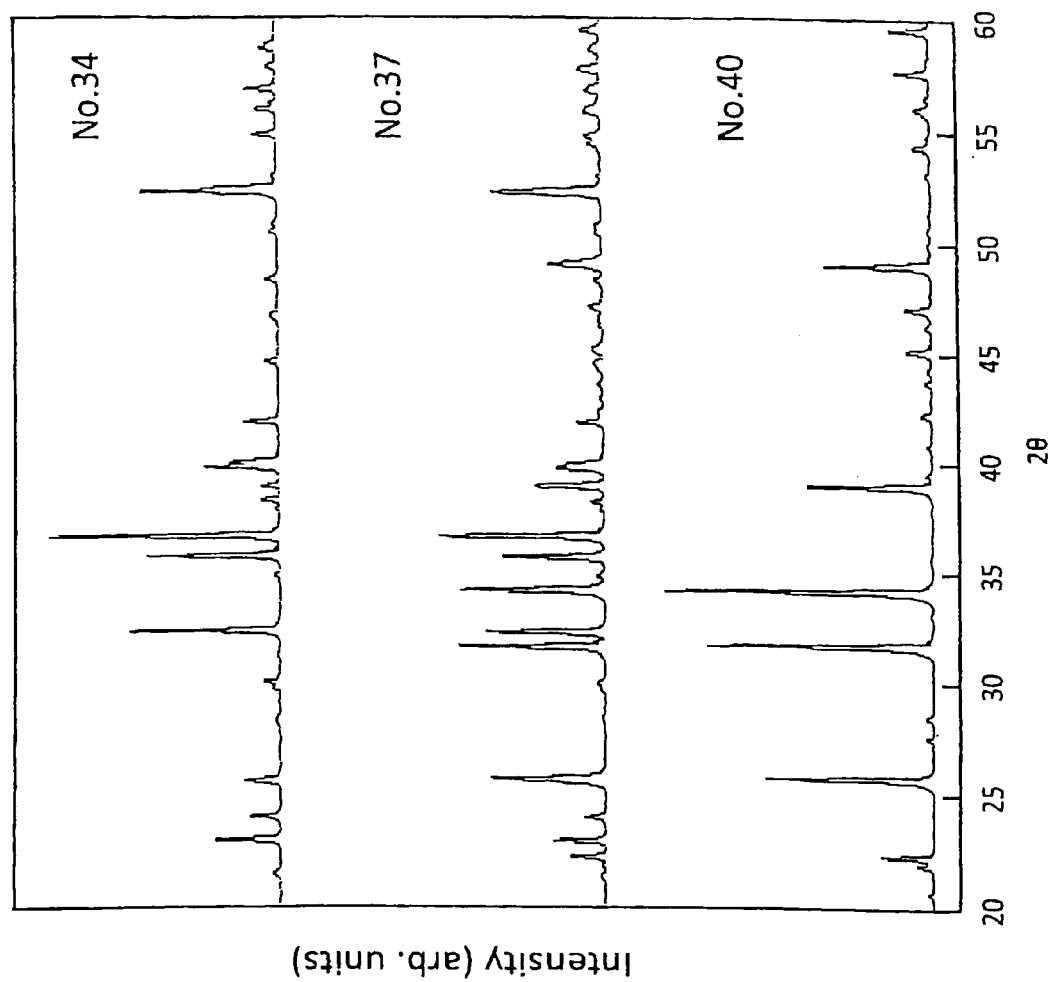
FIG. 8 is X-ray diffraction chart of examples of the present invention.
Figure 9:
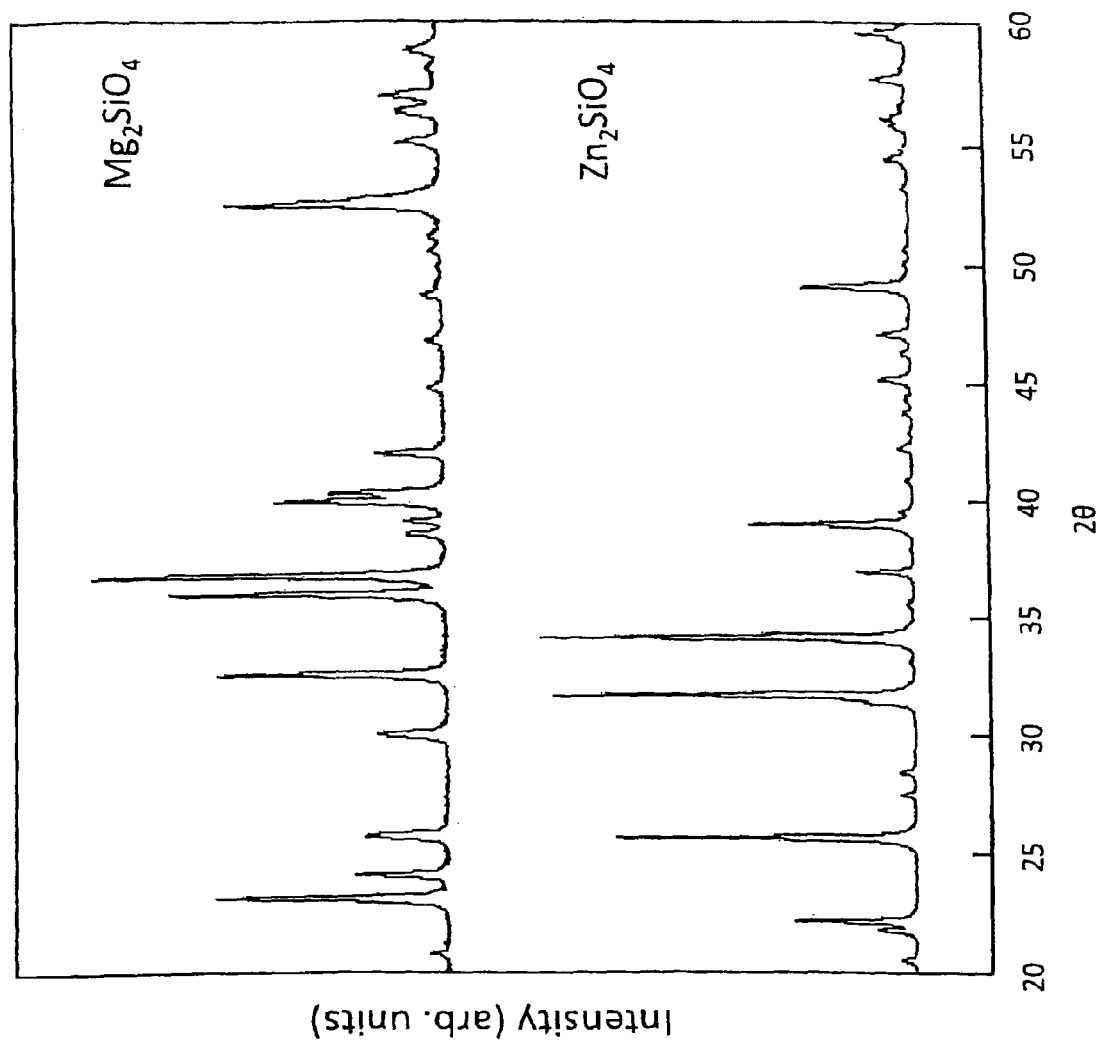
FIG. 9 is X-ray diffraction chart of $Mg_2SiO_4$ and $Zn_2SiO_4$

FIG. 8 shows X-ray diffraction chart of samples 34, 37 and 40. Further, FIG. 9 shows X-ray diffraction chart of $Mg_2SiO_4$ (forsterite) and $Zn_2SiO_4$ (willemite). By comparing FIGS. 8 and 9, sample 34 was confirmed that it only has crystal phase comprising crystal structure of $Mg_2SiO_4$, while sample 37 has the same of $Mg_2SiO_4$ and $Zn_2SiO_4$ and sample 40 has the same of $Zn_2SiO_4$ alone.

Namely, samples 34, 37 and 40 were confirmed to have crystal phase comprising crystal structure of $Mg_2SiO_4$ and/or $Zn_2SiO_4$, even the samples were sintered at a low temperature, i.e. 900° C. Note that, considering X-ray diffraction chart of sample 34, Zn was confirmed to be solid dissolved in $Mg_2SiO_4$ in the sample 34.

Further, samples 31 to 33 were confirmed to have crystal phase comprising crystal structure of $Mg_2SiO_4$ alone and samples 35, 36, 38 and 39 were confirmed to have the same of $Mg_2SiO_4$ and $Zn_2SiO_4$.

Considering above, by changing the ratio of b (MgO content) and c (ZnO content), a ratio of crystal phase comprising crystal structure of $Mg_2SiO_4$ and the same of $Zn_2SiO_4$ can be controlled. As a result, coefficients of linear expansion of dielectric ceramic composition can be set within 40 to 120× 10$^{-7}/°$ C. arbitrarily.

From Table 5, when a value of "d" in the above described general formula is less than a preferred range of the present invention (Samples 41, 42), sintering at 900° C. becomes insufficient, as a result, it can be confirmed that desired properties of insulation resistance and f·Q Value cannot be obtained. Also, when a value of "d" is larger than a preferable range of the present invention (Sample 49), it can be confirmed that f·Q Value becomes deteriorated, even though the sinterability is sufficient.

Contrary to this, when a value of "d" is within a preferable range of the present invention (Samples 43 to 48), it can be confirmed that sufficient sinterability and good property are shown.

Note that, according to the above X-ray diffraction, all the samples (Samples 41 to 49) were confirmed to have crystal phase comprising crystal structure of $Mg_2SiO_4$ and $Zn_2SiO_4$.

As described above, according to the present invention, it is possible to obtain a dielectric ceramic composition maintaining good properties in specific permittivity, f·Q Value and insulation resistance. Also, even when firing at 900° C., it is possible to be sufficiently sintered. In addition, by changing a proportional ratio of MgO amount and ZnO amount, crystal phase comprising crystal structure of forsterite and the same of willemite can be controlled. As a result, coefficients of linear expansion can be changed arbitrarily within a range of 40 to $120 \times 10^{-7}/°$ C., while maintaining good properties of specific permittivity, insulation resistance and f·Q Value.

Therefore, when a dielectric ceramic composition according to the present invention was applied to a multilayer complex electronic device, it is possible to co-fire with a dielectric layer by matching with coefficients of linear expansion of dielectric layers which constitute capacitor portion, so that a multilayer complex electronic device having non-electronic layer with the above favorable properties can be provided. Additionally, since the dielectric ceramic composition according to the present invention shows sufficient sinterability even at 900° C., as conductive material, Ag can be used in a multilayer complex electronic device according to the present invention.

Also, a dielectric ceramic composition of the present invention is favorably used for a multilayer common mode filter, a multilayer ceramic coil, a multilayer ceramic capacitor wherein a conductive material is composed of Ag according to the present invention.

What is claimed:

1. A dielectric ceramic composition comprising;
   as a main component, Cu oxide, Si oxide, Mg oxide and Zn oxide,
   as a subcomponent, a glass component including B oxide and at least one selected from the group consisting of Si oxide, Ba oxide, Ca oxide, Sr oxide, Li oxide and Zn oxide, and having a glass softening point is 750° C. or less, wherein;
   a content of said glass component is 1.5 to 15 wt % with respect to 100 wt % of said main component:
   the composition includes crystal phase comprising crystal structure of forsterite and willemite: and
   when said main component is shown by a general formula

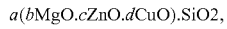

$a(b\text{MgO}.c\text{ZnO}.d\text{CuO}).\text{SiO}_2$, a is 1.5 to 2.4, c is 0.10 to 0.92, d is 0.02 to 0.18, wherein b+c+d=1.00 and b>0.

2. A multilayer complex electronic device comprising;
   a coil portion constituted by a coiled conductor and a non-magnetic layer, and
   a capacitor portion constituted by an internal electrode layer and a dielectric layer, wherein;
   said coiled conductor and/or said internal electrode layer include(s) Ag as a conductive material,
   said non-magnetic layer is constituted by the dielectric ceramic composition as set forth in claim 1.

3. A multilayer common mode filter comprising;
   a filter portion constituted by a coiled conductor and a non-magnetic layer, and
   an external layer portion constituted by a magnetic layer, wherein;
   said coiled conductor includes Ag as a conductive material,
   said non-magnetic layer is constituted by the dielectric ceramic composition as set forth in claim 1.

4. A multilayer complex electronic device comprising;
   a capacitor portion constituted by an internal electrode layer and a dielectric layer,
   a common mode filter portion comprising a coiled conductor and a non-magnetic layer, and
   an external layer portion constituted by a magnetic layer, wherein;
   said coiled conductor and/or said internal electrode layer include(s) Ag as a conductive material,
   said non-magnetic layer is constituted by the dielectric ceramic composition as set forth in claim 1.

5. A multilayer ceramic coil comprising;
   a coil portion constituted by stacking a coiled conductor and a non-magnetic layer, wherein;
   said coiled conductor includes Ag as a conductive material,
   said non-magnetic layer is constituted by the dielectric ceramic composition as set forth in claim 1.

6. A multilayer ceramic capacitor comprising,
   an element body wherein an internal electrode layer and a dielectric layer are alternately stacked, wherein;
   said internal electrode layer includes Ag as a conductive material, said dielectric layer is constituted by the dielectric ceramic composition as set forth in claim 1.

* * * * *